United States Patent
Themm

(10) Patent No.: US 10,107,836 B2
(45) Date of Patent: Oct. 23, 2018

(54) TALKING TEST LIGHT

(71) Applicants: Bosch Automotive Service Solutions Inc., Warren, MI (US); Robert Bosch GmbH, Stuttgart (DE)

(72) Inventor: Jeremy Themm, Schoolcraft, MI (US)

(73) Assignees: Bosch Automotive Service Solutions Inc., Warren, MI (US); Robert Bosch GmbH, Stuttgart (DE)

(*) Notice: Subject to any disclaimer, the term of this patent is extended or adjusted under 35 U.S.C. 154(b) by 107 days.

(21) Appl. No.: 14/979,163

(22) Filed: Dec. 22, 2015

(65) Prior Publication Data

US 2016/0187383 A1 Jun. 30, 2016

Related U.S. Application Data

(60) Provisional application No. 62/097,249, filed on Dec. 29, 2014.

(51) Int. Cl.
 *G01R 1/067* (2006.01)
 *G01R 31/02* (2006.01)

(52) U.S. Cl.
 CPC ........ *G01R 1/06788* (2013.01); *G01R 31/026* (2013.01)

(58) Field of Classification Search
 CPC ... G01V 3/18; G01V 1/52; G01V 3/34; G01V 3/38; G01V 5/04
 USPC .......................... 324/333, 334, 338, 339, 346
 See application file for complete search history.

(56) References Cited

U.S. PATENT DOCUMENTS

| 4,525,715 | A | * | 6/1985 | Smith | E21B 47/122 |
| | | | | | 175/50 |
| 4,864,226 | A | | 9/1989 | Tachimoto et al. | |
| 6,433,530 | B1 | | 8/2002 | Pool | |
| 7,143,659 | B2 | * | 12/2006 | Stout | F17D 5/00 |
| | | | | | 324/71.2 |
| 7,526,971 | B2 | * | 5/2009 | Mandziuk | F16L 55/38 |
| | | | | | 73/866.5 |

(Continued)

OTHER PUBLICATIONS

OTC, "Circuit Tester with Interchangeable Probe", https://www.otctools.com/products/circuit-tester-interchangeable-probe, accessed Dec. 15, 2015.

(Continued)

*Primary Examiner* — Giovanni Astacio-Oquendo
(74) *Attorney, Agent, or Firm* — Maginot Moore & Beck LLP

(57) ABSTRACT

A hand-held electric circuit tester includes a probe. The probe includes a hollow body, a control circuit, a probe member, and a speaker. The probe member is operatively mounted in the hollow body, and is configured to contact a probe location of an electric circuit to be measured and electrically connect the probe location with the control circuit to produce a measurement. The control circuit is configured to generate a voice signal with reference to the measurement of the probe and output the voice signal to the speaker, which is configured to generate a voice output with reference to the voice signal indicative of the measurement. The probe can include a first switch for operating the probe member, a microphone for voice activation, or a second switch for selecting between different voices for the voice output, with the different voices stored in computer-readable memory.

19 Claims, 3 Drawing Sheets

(56) References Cited

U.S. PATENT DOCUMENTS

2017/0060150 A1* 3/2017 Stefanski ............... G05D 23/27
2018/0036740 A1* 2/2018 Nelson .................... B02C 19/18
2018/0059176 A1* 3/2018 Ding .................. G01R 31/2891

OTHER PUBLICATIONS

Matco Tools, "Super Test Light", http://www.matcotools.com/catalog/product/SST42V/SUPER-TEST-LIGHT/, accessed Dec. 15, 2015.
Snap-On, "Circuit Tester, Digital Display, Green", https://store.snapon.com/Digital-Display-Circuit-Testers-Circuit-Tester-Digital-Display-Green-P806645.aspx, accessed Dec. 17, 2015.

* cited by examiner

TALKING TEST LIGHT

RELATED APPLICATION

This Application claims priority to U.S. Provisional Application No. 62/097,249 filed on Dec. 29, 2014, entitled "TALKING TEST LIGHT," the disclosure of which is incorporated by reference herein in its entirety.

TECHNICAL FIELD

This disclosure relates generally to diagnostic tools for electrical circuits, and, more particularly, to hand held continuity and polarity test devices.

BACKGROUND

Meters for making electrical measurements by contacting points to be measured with measurement probes are well-known. An example of such a known meter is a digital multimeter. Conventionally these meters indicate the measured value on either an analog or a digital visual display while the measurement probes are in contact with the points to be measured. The user is therefore required to view the display to read the measured value while maintaining the measurement probes in contact with the points to be measured, which can be difficult in some cases.

This difficulty can be exacerbated by the size and/or arrangement of circuit components and surrounding materials. For example, in recent years, the electronics industry has tended toward high-density electronic circuits. In such circuits the electrical parts and connections are physically mounted close together to reduce the overall size of the circuit. These high density circuits often require electrical testing by measuring the voltages, currents or resistances of various points in the circuit with a meter to verify proper operation. The physically small size of the parts requires test personnel to accurately manipulate the meter's measurement probes to make contact with portions of the circuit. This manipulation is often difficult even if the operator has a clear and unobstructed view of the meter probes and the measurement point at the time when contact is made.

U.S. Pat. No. 6,433,530, issued on Aug. 13, 2002 describes a hand held, i.e. pen type circuit and polarity tester, the disclosure of which is incorporated by reference in its entirety. Where a definition or use of a term in a reference is inconsistent or contrary to the definition of that term provided herein, the definition of that term provided herein applies herein and the definition of that term in the reference does not apply. Pen type probes generally include one or more contact leads that are attached to various locations of an electrical circuit or ground, and a probe that is easily manipulated with a single hand of a user to contact a measurement point. A light, such as an LED, or a buzzer indicates one or more characteristics of the measurement point.

In some applications, it is desirable for the probe to indicate more detailed information about the measurement point. FIG. 1 illustrates an example of a known probe device with a digital display; item EECT400, available from Snap-On USA, which includes an LCD that displays a measurement voltage, and green and red LEDs that respectively indicate operative ground and power connections. However, in many cases, testing a measurement point requires moving the probe to a position that results in the portion having the LEDs and/or voltage display being obstructed or not visible to the user.

U.S. Pat. No. 4,864,226, issued Sep. 5, 1989, describes a multimeter that includes a meter which includes a voice synthesizer, and a measurement probe that includes a voice output switch. When a user presses the voice output switch, the voice synthesizer converts a measurement into a voice signal. This enables a user to manipulate the probe with one hand and use the voice output button to take measurements when the probe or meter is out of view. However, the meter is not optimized for the testing of high-density electronic circuits. In an example, the body of the meter can prevent the probe from reaching a measurement point. In another example, there may not be a surface available upon which to rest the meter, requiring a second hand of the user.

Therefore, what is needed is a circuit testing device that can output detailed information about a measurement point without requiring a separate meter body, so as to enable a user manipulate the device with a single hand.

SUMMARY

In order to facilitate testing electric circuits when the user's view may be obstructed, or when both of the user's hands are not free to manipulate a tool, a circuit tester according to this disclosure includes a probe and a contact end connected via a wire. The contact end includes a ground contact plug configured to electrically connect with a ground, and a power source plug configured to electrically connect with a power source of an electric circuit. The probe includes a hollow body, a control circuit, a probe member, and a speaker. The contact end is electrically connected to the control circuit via the wire. The control circuit is at least partially disposed in the hollow body. The probe member is operatively mounted on the hollow body and configured to contact a probe location of the electric circuit to be measured and electrically connect the probe location with the control circuit to produce a measurement. The speaker is at least partially disposed in the hollow body, and is electrically connected to the control circuit.

The control circuit is configured to generate a voice signal with reference to the measurement of the probe, the ground, and the power source, and is further configured to output the voice signal to the speaker. The speaker is configured to generate a voice output with reference to the voice signal indicative of the measurement.

In an embodiment, the probe further includes a first switch operatively connected to the control circuit and configured to generate an activation signal. The control circuit is further configured to generate the voice signal responsive to receiving the activation signal. In one embodiment, the first switch is disposed on a side of the hollow body.

In another embodiment, the probe further includes a computer readable memory that is operatively connected to the control circuit, and that includes voice data corresponding to at least one voice. In a further embodiment, the control circuit includes an onboard computer-readable memory that includes voice data corresponding to at least one voice. The control circuit is further configured to generate the voice signal with reference to the at least one voice.

In an embodiment, the probe further includes a second switch, and the computer readable memory includes voice data corresponding to a plurality of different voices. The second switch is operatively connected to the control circuit, and is selectably operable to generate a voice selection signal corresponding to one of the plurality of voices of the computer readable memory. The control circuit is further configured to generate the voice signal with reference to the one of the plurality of voices in the computer readable memory selected via the second switch.

In one embodiment, the second switch is disposed on an end of the hollow body facing the wire. In an embodiment, the second switch defines a shape contiguous with the hollow body, and is embodied as a twistable knob.

In another embodiment, the first switch and the computer readable memory are integral with each other to form a cartridge, and the hollow body is configured to removable receive the cartridge.

In a further embodiment, the probe further includes a microphone. The microphone is electrically connected to the control circuit, and is configured to capture audio signals and transmit the audio signals to the control circuit. The control circuit is further configured to isolate a voice command of a user from the audio signals, and generate the voice signal in response to the voice command.

In an embodiment, the probe further includes an indicator electrically connected to the control circuit and configured to generate an output indication indicative of the measurement. In one embodiment, the hollow body is formed, at least in part, from a substantially transparent material, and the indicator is disposed within the hollow body so as to be visible by a user through the substantially transparent material.

DETAILED DESCRIPTION

For the purposes of promoting an understanding of the principles of the embodiments described herein, reference is now made to the drawings and descriptions in the following written specification. No limitation to the scope of the subject matter is intended by the references. This disclosure also includes any alterations and modifications to the illustrated embodiments and includes further applications of the principles of the described embodiments as would normally occur to one skilled of ordinary skill in the art to which this document pertains.

Figure 1:
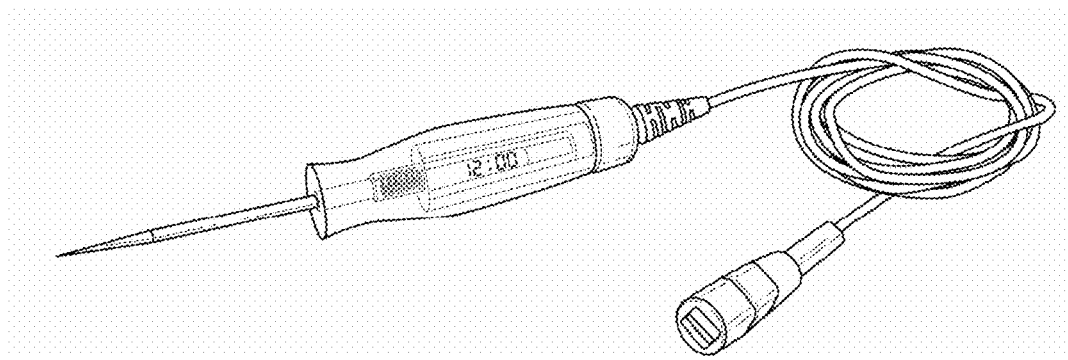
FIG. 1 is a perspective image of a known circuit tester probe device.
Figure 2:
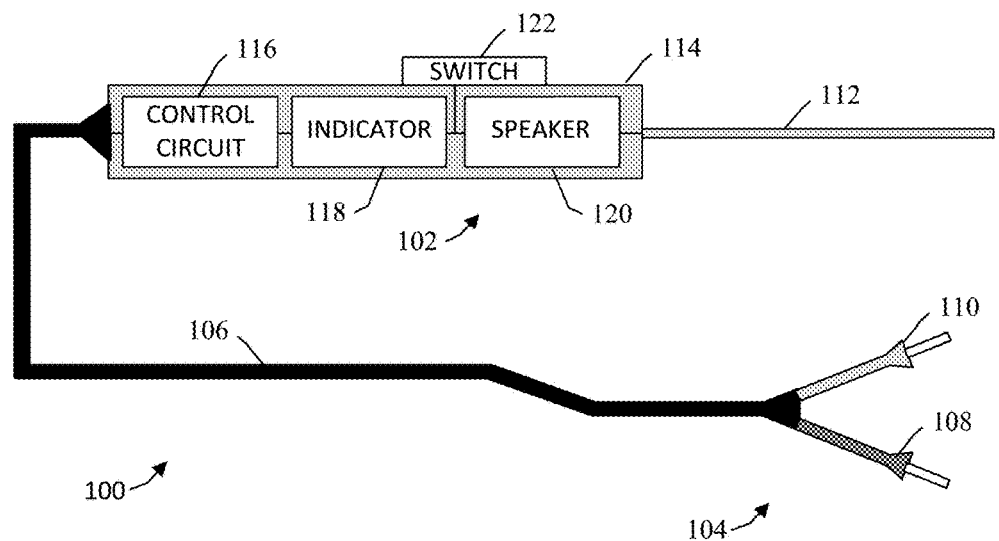
FIGS. 2 and 3 are schematic views of different exemplary embodiments of a circuit tester according to this disclosure.

FIG. 2 depicts a schematic of an exemplary embodiment of a circuit tester 100 according to this disclosure that is configured to output a measurement to a user via a voice signal, a sound signal, or the like. The circuit tester 100 includes a probe 102, and a contact end 104 electrically connected to the probe 102 via a wire 106.

In this embodiment, the contact end 104 includes a ground contact plug 108 and a power contact plug 110. The ground contact plug 108 is configured to connect with a ground of an electric circuit, and the power contact plug 110 is configured to connect with a power source of the electric circuit. In other embodiments, the contact end 104 includes different numbers and types of contacts configured to connect with different portions of the electrical circuit.

The probe 102 includes a measurement member 112, and a handle portion 114 that has a control circuit 116, an indicator 118, a speaker 120, and a switch 122. The handle portion 114 preferably includes an electrically insulating material to enable the user to grip the handle portion 114 without being exposed to an electrical current or voltage. The handle portion 114 is generally hollow, such that the control circuit 116 is housed therein. In this embodiment, the indicator 118 and speaker 120 is also housed at least partially within the handle portion 114, and the switch 122 is mounted on an exterior of the handle portion 114.

The handle portion 114 is configured to expose an output of at least one of the indicator 118 and the speaker 120 to an exterior of the handle portion 114. In one embodiment, the handle portion 114 is at least partially transparent such that at least a portion of the indicator 118 mounted within the handle portion 114 is visible to a user. In another embodiment, the handle portion 114 defines an opening configured to expose a portion of the interior of the handle portion 114 so that the indicator 118 is visible to a user therethrough. In a further embodiment, the material of the handle portion 114 is configured to enable sound from the speaker 120 to be transmitted therethrough. In other embodiments, the indicator 118 and/or the speaker 120 are mounted on an exterior of the handle portion 114.

In the embodiment illustrated in FIG. 2, the switch 122 is a button configured to be activated by being pressed by a user, but other types of switches are also contemplated. The switch 122 is electrically connected to the control circuit 116 and is configured to generate an activation signal. In another embodiment, the switch 122 includes a microphone that is configured to generate the activation signal in response to a user's voice command. In an example, speech of the user is captured via the microphone of the switch 122, whereby the switch 122 generates the activation signal in response to capturing the user's speech. In one embodiment, the switch 122 is configured to determine whether the speech captured by the microphone comes from a particular user, or includes a particular phrase. For example, the switch can be configured to generate an activation signal upon capturing the phrase "check voltage" or other acceptable phrases. In one embodiment, the switch 122 is configured to transmit an electrical signal indicative of audio captured via the microphone, and the control circuit 116 is configured to isolate spoken phrases from the captured audio and determine whether the captured audio includes the particular phrase or is from the particular user. In other embodiments the microphone is included with other elements of the circuit tester 100, such as the handle portion 114 or control circuit 116, and is included instead of or in addition to the switch 122.

The measurement member 112 is a linear member mounted on an end of the probe 102, and is configured to connect with a measurement point of an electric circuit that is desirably measured, and is configured to be electrically connected with the control circuit 116. In an example, the measurement member 112 can be mounted in the handle portion 114 via a spring (not shown). The spring is configured to act on the measurement member 112 with a biasing force that acts to move the measurement member 112 to a positon whereat the measurement member 12 is electrically isolated from the control circuit 116. Once the bias force is overcome, such as via a user depressing the measurement probe 112 onto a measurement point of a circuit, the measurement member 112 moves into electrical contact with the control circuit 116.

The measurement member 112 can include, for example, a non-conductive body and a conductive tip and internal core. Other types of acceptable measurement members are also contemplated. At least a portion of the measurement member 112 includes a conductive material such as a metal.

The control circuit 116 is also electrically connected with the ground contact plug 108 and power contact plug 110 of the contact end 104 via the wire 106, and is configured to determine a measurement of the measurement point with reference to currents and/or voltages transmitted from the ground by the ground contact plug 108, from the power source by the power contact plug 110, and from the measurement point by the measurement member 112, and generate an electrical signal indicative of the determined measurement. In one embodiment, the control circuit 116 includes a voltmeter, a multimeter, or other acceptable electrical measurement circuits.

The indicator 118 is electrically connected with the control circuit 116, and is configured to receive the electrical signal indicative of the determined measurement and output an indication of the determined measurement. In various embodiments, the indicator 118 can include different indication components that enable the indicator 118 to output information describing the determined measurement of the measurement point. In one embodiment, the indicator 118 includes a first colored LED indicative of a powered condition of the measurement point, a second colored LED indicative of a ground condition of the measurement point, and a third LED indicative of an open circuit condition of the measurement point. Other numbers of LEDs and LEDs indicative of other types of information are also contemplated. In one embodiment, the indicator 118 includes an LCD display configured to digitally display information with reference to the determined measurement. In one embodiment, the indicator 118 includes a buzzer configured to buzz in order to indicate, for example, a powered condition or another condition of the measurement point.

The speaker 120 is electrically connected to the control circuit 116 and is configured to generate a voice output with reference to a voice signal. When the control circuit 116 is activated, the control circuit 116 is configured to generate the voice signal with reference to the determined measurement, and transmit the voice signal to the speaker 120. The voice output generated by the speaker 120 includes spoken language audio indicative of the determined measurement. In an example, the voice output includes a voice speaking the phrase "12.2 volts", "Ground detected", "Open Circuit detected", etc. In this embodiment, the control circuit 116 further includes a voice synthesizer and/or voice sample data to enable generation of the voice signal.

The features described above enable a user to connect the contact end 104 to the electric circuit, and manipulate the probe 102 in an unobstructed manner with a single hand to investigate a measurement point of the electric circuit. The switch 122 can be activated using the same hand of the user that is manipulating the probe 102, or via the user's voice, freeing the other hand of the user to, for example, hold or manipulate other equipment, support the user, or other activities.

Figure 3:
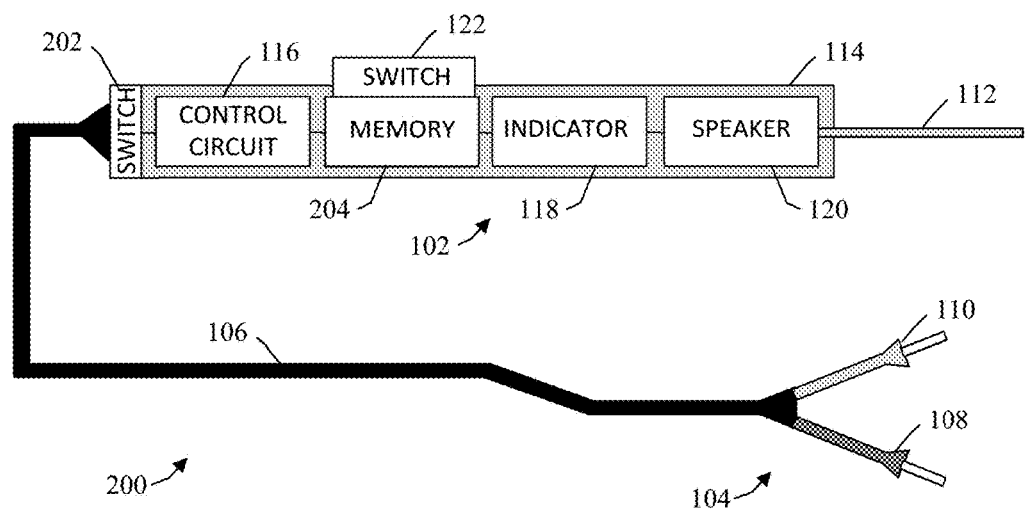

FIG. 3 illustrates another exemplary embodiment of a circuit tester 200 that is similar to the embodiment of FIG. 2, but further includes a second switch 202, and a memory 204. In other embodiments, a circuit tester includes the second switch and not the memory, or vice versa. The second switch 202 as illustrated in this embodiment is embodied as a twistable portion of the handle portion 114. In an example, a user can activate the second switch 202 by twisting the second switch 202 or handle portion 114 relative to each other. Other types of switches are also contemplated, including buttons, toggles, and dials. The second switch 202 is electrically connected to the control circuit 116 and is configured to generate a voice selection signal.

The voice output generated by the speaker 120 can be selectively configured to resemble a voice of different people. For example, the voice output can be configured to resemble a voice of a person of a particular gender, ethnicity, accent, or a voice of a specific individual such as a person with a well-known voice. In this embodiment, the control circuit 116 is further configured to select a voice to be generated by the speaker 120 that resembles a particular voice from amongst a plurality of different voices with reference to the voice selection signal.

In one embodiment, the control circuit 116 is further configured to cause the speaker 120 to generate a male voice when the second switch 202 is in a first position and a female voice when the second switch 202 is in a second position. It should be understood that the second switch 202 can include other numbers of positions corresponding to other voice options. These features enable a user to select a desired voice for the voice output generated by the speaker 120.

Voice data corresponding to different voices can be stored, for example, in a computer readable memory 204. In this embodiment, the memory 204 is separate from and electrically connected to the control circuit 116, and is also electrically connected to the speaker 120. In one embodiment, the memory 204 is embodied as a removable cartridge whereby a user can select a different voice or voices by inserted a cartridge that includes corresponding voice data. The cartridge can be, for example, a non-volatile memory card such as an SD-card, and the handle portion 114 can define a slot for inserting and removing the memory cartridge.

In this embodiment, the switch 122, rather than being positioned on an exterior of the handle portion 114, is integrally formed with the cartridge of memory 204, such that when no cartridge of memory 204 is installed in the handle portion 114, the handle portion 114 does not include the switch 122. In other embodiments, the switch 122 is formed separately from the memory 204.

In another embodiment, the control circuit 116 includes an onboard memory that includes voice data. The control circuit 116 can thus enable operation of the circuit tester 200 when no cartridge is present, or can supplement the voice data in the memory 204. For example, the control circuit 116 can include voice data corresponding to at least one default voice, whereby additional voices are enabled through installation of the memory 204. In another embodiment, the second switch 202 is integrally formed with the cartridge.

It should be understood that while the control circuit 116, memory 204, indicator 118, speaker 120, switch 122, and second switch 202, have been described above as separate components, in other embodiments, one or more of these components can be combined into a single component, or a single component can be distributed amongst multiple components. Further, not all of the components may be necessary. In one embodiment, the probe does not include an indicator, and is only configured to output measurements via the voice output. In one embodiment, the different components are assembled on a circuit board. In one embodiment, the control circuit 116 includes a processor and/or an integrated logic circuit. In one embodiment, at least one of the components is a printed circuit or device.

Figure 4:
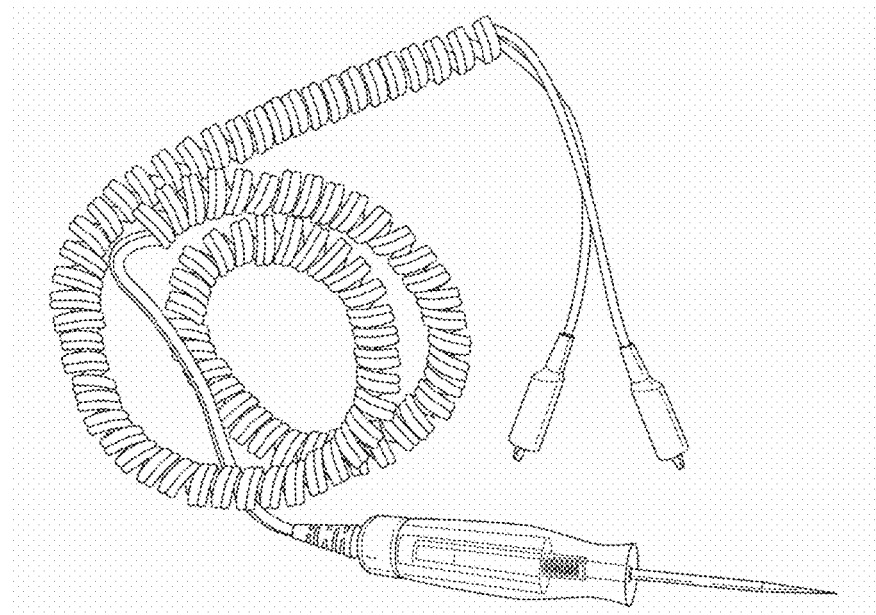
FIG. 4 is a top view image of a circuit tester according to this disclosure.
Figure 5:
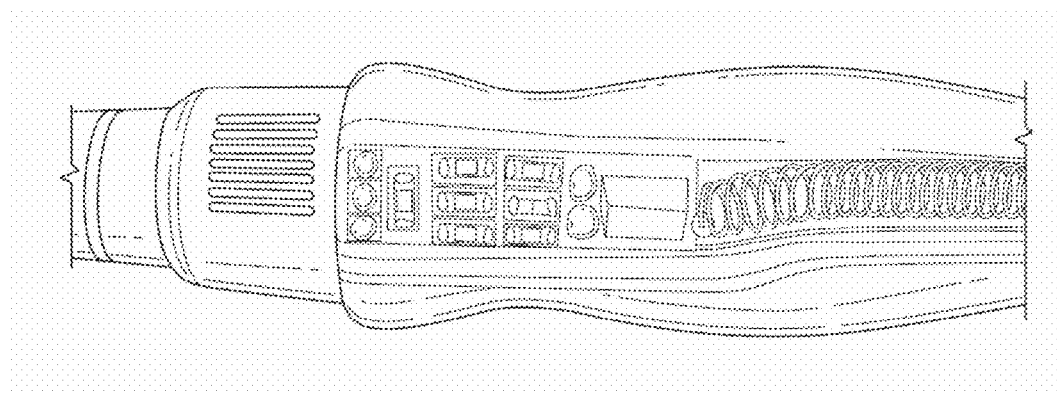
FIG. 5 is a detail view image of the probe of the circuit tester illustrated in FIG. 4.

FIG. 4 illustrates an image of an exemplary circuit tester according to this disclosure, and FIG. 5 illustrates a detail image of the probe unit of the circuit tester of FIG. 4.

Additional Embodiments Include

A probe for a circuit tester includes a control circuit configured to generate a voice signal with reference to a measurement of the probe, and a speaker that is electrically connected to the control circuit and that is configured to generate a voice output with reference to the voice signal.

The control circuit is configured to generate the voice signal in response to an activation signal generated by a switch when the switch is activated.

A microphone is configured to capture audio signals, and the control circuit is configured to generate the voice signal in response to a voice command of the user.

The probe further includes an indicator configured to generate an output indication indicative of the measurement. The indicator includes at least one of an LED indicative of a power condition, an LED indicative of a ground condition, an LED indicative of an open circuit condition, an LCD display configured to display digital or text data corresponding to the measurement, and a buzzer.

The control circuit and/or the speaker are configured to cause a voice of the voice output to resemble at least one voice of a person.

The control circuit and/or the speaker are configured to selectively cause a voice of the voice output to resemble different voices of different persons. The probe further includes a second switch that is electrically connected to the control circuit and that is configured to generate a voice selection signal, and the control circuit is configured to selectively cause the voice output to resemble a particular voice with reference to the voice selection signal.

The probe further includes a memory that has voice data corresponding to at least one voice. The memory is embodied as a removable cartridge. At least one of the switch and the second switch is formed integrally with the cartridge.

It will be appreciated that variants of the above-described and other features and functions, or alternatives thereof, may be desirably combined into many other different systems, applications or methods. Various presently unforeseen or unanticipated alternatives, modifications, variations or improvements may be subsequently made by those skilled in the art that are also intended to be encompassed by the disclosure.

What is claimed is:

1. A probe device for a hand-held circuit tester, comprising:
   a control circuit;
   a probe member configured to contact a probe location of an electric circuit to be measured and electrically connect the probe location with the control circuit to produce a measurement; and
   a speaker electrically connected to the control circuit, the control circuit configured to generate a voice signal with reference to the measurement of the probe member and output the voice signal to the speaker, and the speaker configured to generate a voice output with reference to the voice signal indicative of the measurement.

2. The probe device of claim 1, further comprising:
   a hollow body,
   wherein the control circuit, probe member, and speaker are each at least partially mounted within the hollow body.

3. The probe device of claim 2, further comprising:
   a first switch operatively connected to the control circuit and configured to generate an activation signal,
   the control circuit further configured to generate the voice signal responsive to receiving the activation signal.

4. The probe device of claim 3, wherein the first switch is disposed on a side of the hollow body.

5. The probe device of claim 4, further comprising:
   a non-transitory computer readable memory that is operatively connected to the control circuit, and that includes voice data corresponding to at least one voice;
   the control circuit further configured to generate the voice signal with reference to the at least one voice.

6. The probe device of claim 5, further comprising:
   a second switch;
   the non-transitory computer readable memory including voice data corresponding to a plurality of different voices;
   the second switch operatively connected to the control circuit, and selectably operable to generate a voice selection signal corresponding to one of the plurality of voices in the non-transitory computer readable memory; and
   the control circuit further configured to generate the voice signal with reference to the one of the plurality of voices in the non-transitory computer readable memory selected via the second switch.

7. The probe device of claim 5, wherein:
   the first switch and the non-transitory computer readable memory are integral with each other to form a cartridge; and
   the probe device is configured to removably receive the cartridge.

8. The probe device of claim 1, further comprising:
   a microphone that is electrically connected to the control circuit, and that is configured to capture audio signals and transmit the audio signals to the control circuit;
   the control circuit further configured to isolate a voice command of a user from the audio signals, and generate the voice signal in response to the voice command.

9. The probe device of claim 1, further comprising:
   an indicator electrically connected to the control circuit and configured to generate an output indication indicative of the measurement.

10. The probe device of claim 9, further comprising:
    a hollow body formed, at least in part, from a substantially transparent material, the indicator disposed within the hollow body so as to be visible by a user through the substantially transparent material.

11. An electric circuit tester, comprising:
    a probe device that includes:
      a hollow body;
      a control circuit at least partially disposed in the hollow body;
      a probe member operatively mounted on the hollow body and configured to contact a probe location of an electric circuit to be measured and electrically connect the probe location with the control circuit to produce a measurement; and
      a speaker at least partially disposed in the hollow body, and electrically connected to the control circuit;
    a contact end that includes:
      a ground contact plug configured to electrically connect with a ground; and
      a power source plug configured to electrically connect with a power source of the electric circuit; and
    a wire that electrically connects the contact end with the control circuit;
    the control circuit configured to generate a voice signal with reference to the measurement of the probe member, the ground, and the power source, and further configured to output the voice signal to the speaker; and the speaker configured to generate a voice output with reference to the voice signal indicative of the measurement.

12. The circuit tester of claim 11, the probe device further including:
a first switch operatively connected to the control circuit and configured to generate an activation signal,
the control circuit further configured to generate the voice signal responsive to receiving the activation signal.

13. The circuit tester of claim 12, wherein the first switch is disposed on a side of the hollow body.

14. The circuit tester of claim 13, the probe device further including:
a non-transitory computer readable memory that is operatively connected to the control circuit, and that includes voice data corresponding to at least one voice;
the control circuit further configured to generate the voice signal with reference to the at least one voice.

15. The circuit tester of claim 14, the probe device further including:
a second switch;
the non-transitory computer readable memory including voice data corresponding to a plurality of different voices;
the second switch operatively connected to the control circuit, and selectably operable to generate a voice selection signal corresponding to one of the plurality of voices in the non-transitory computer readable memory; and
the control circuit further configured to generate the voice signal with reference to the one of the plurality of voices in the non-transitory computer readable memory selected via the second switch.

16. The circuit tester of claim 14, wherein:
the first switch and the non-transitory computer readable memory are integral with each other to form a cartridge; and
the hollow body is configured to removable receive the cartridge.

17. The circuit tester of claim 11, the probe device further including:
a microphone that is electrically connected to the control circuit, and that is configured to capture audio signals and transmit the audio signals to the control circuit;
the control circuit further configured to isolate a voice command of a user from the audio signals, and generate the voice signal in response to the voice command.

18. The circuit tester of claim 11, the probe device further including:
an indicator electrically connected to the control circuit and configured to generate an output indication indicative of the measurement.

19. The circuit tester of claim 18, wherein:
the hollow body formed, at least in part, from a substantially transparent material; and
the indicator is disposed within the hollow body so as to be visible by a user through the substantially transparent material.

* * * * *